(12) United States Patent
Kusachi

(10) Patent No.: US 6,542,036 B2
(45) Date of Patent: Apr. 1, 2003

(54) LOW CURRENT AMPLIFIER CIRCUIT WITH PROTECTION AGAINST STATIC ELECTRICITY

(75) Inventor: Keiji Kusachi, Tokyo (JP)

(73) Assignee: NEC Compound Semicoductor Devices, Ltd., Kanagawa (JP)

(*) Notice: Subject to any disclaimer, the term of this patent is extended or adjusted under 35 U.S.C. 154(b) by 110 days.

(21) Appl. No.: 09/769,540

(22) Filed: Jan. 25, 2001

(65) Prior Publication Data

US 2001/0009390 A1 Jul. 26, 2001

(30) Foreign Application Priority Data

Jan. 26, 2000 (JP) ........................................ 2000-017187

(51) Int. Cl.[7] .............................. H03F 1/22; H03F 1/52
(52) U.S. Cl. ...................................... 330/298; 330/311
(58) Field of Search ................................ 330/277, 296, 330/302, 311, 298

(56) References Cited

U.S. PATENT DOCUMENTS 6,392,490 B1 * 5/2002 Gramegna et al. ...... 330/311 X
6,407,640 B1 * 6/2002 Aparin et al. ................ 330/302

FOREIGN PATENT DOCUMENTS

| JP | 2-105468 | 4/1990 | ......... H01L/29/784 |
| JP | 4-105358 | 4/1992 | ......... H01L/27/088 |
| JP | 2882309 | 2/1999 | ....... H01L/21/8238 |

* cited by examiner

*Primary Examiner*—Steven J. Mottola
(74) *Attorney, Agent, or Firm*—Hayes Soloway P.C.

(57) ABSTRACT

A low current amplifier circuit which stably operates at a low current and has a reduced tendency to cause static breakdown includes first and second field-effect transistors. The first field-effect transistor has a gate with a small width for passing a small current when a bias voltage is applied to the gate to compensate for variations in threshold voltage. The second field-effect transistor has a gate with a larger width than that of the first field-effect transistor and a source connected to a drain of the first field-effect transistor. The second field-effect transistor reduces a current flowing through the first field-effect transistor due to static electricity.

7 Claims, 4 Drawing Sheets

LOW CURRENT AMPLIFIER CIRCUIT WITH PROTECTION AGAINST STATIC ELECTRICITY

BACKGROUND OF THE INVENTION

1. Field of the Invention

The present invention relates to an amplifier circuit which operates at a low current.

2. Description of the Related Art

An LO (Local Oscillator) buffer amplifier is one of amplifier circuits for local oscillator peripheral circuits used in a frequency converter in a receiving section of a cellular phone. In recent years, since low power consumption is highly required in cellular phones, the LO buffer amplifier need operate at a low current of approximately 1 to 2 mA.

FIG. 1 is an equivalent circuit diagram of an amplifier circuit of a first prior art with a pseudo enhancement mode HJ (Hetero Junction)-FET. The pseudo enhancement mode HJ-FET refers to a hetero-junction field-effect transistor with a threshold voltage Vth of approximately −0.1 V.

The amplifier circuit of the first prior art comprises input/output circuit 15 for amplifying an input signal at a radio frequency and providing an output signal, power supply circuit 25 for supplying input/output circuit 15 with power, active bias circuit 35 for supplying input/output circuit 15 with a bias voltage, and capacitor 154 for removing direct-current components in the output signal. Input/output circuit 15 and active bias circuit 35 are arranged within an IC such as an MMIC (Monolithic Microwave Integrated Circuit) with a pseudo enhancement mode HJ-FET, and power supply circuit 25 and capacitor 154 are provided outside the IC.

Input/output circuit 15 includes capacitor 151 for removing direct-current components in the input signal, resistor 152 for providing a load to the bias voltage supplied from active bias circuit 35, and field-effect transistor 153 for amplifying the input signal. Capacitor 151 is connected between an input terminal and a gate of field-effect transistor 153. Resistor 152 is connected between an input from active bias circuit 35 and the gate of field-effect transistor 153. A source of field-effect transistor 153 is grounded. Field-effect transistor 153 has a gate width of 200 μm, and if the bias voltage is, for example 0.2 V, a current of approximately 6 mA flows.

A drain of field-effect transistor 153 is connected to one terminal of capacitor 154, and the other terminal of capacitor 154 serves as the output from the amplifier circuit.

Power supply circuit 25 includes voltage source 251 for supplying a direct-current voltage, capacitor 252 for removing noise in the power supply, and load inductor 253 for providing a load to output from voltage source 251. Capacitor 252 is connected between an output of voltage source 251 and a ground potential. Load inductor 253 has one terminal connected to the output of voltage source 251 and the other terminal connected to the drain of transistor 153.

Active bias circuit 35 includes field-effect transistor 351 for controlling the bias voltage supplied to input/output circuit 15, and resistors 352, 353, and 354. Resistor 352 has one terminal connected to the drain of field-effect transistor 153 and the other terminal which is connected to a drain of field-effect transistor 351 and to one terminal of resistor 353 and supplies the bias voltage to input/output circuit 15. The other terminal of resistor 353 is connected to a gate of field-effect transistor 351 and to one terminal of resistor 354. A source of field-effect transistor 351 and the other terminal of resistor 354 are grounded.

In the amplifier circuit of the first prior art, input/output circuit 15 supplied the power from power supply circuit 25 biases an input signal with the bias voltage provided by active bias circuit 35, and amplifies and provides the signal.

FIG. 2 is an equivalent circuit diagram showing an amplifier circuit of a second prior art.

The amplifier circuit of the second prior art has field-effect transistor 161 with a gate width of 50 μm instead of field-effect transistor 153 in the first prior art, and the remaining configuration is the same as that of the first prior art.

Since the gate width is as thin as 50 μm in the second prior art, it is possible to suppress a current to approximately 0.2 mA even when a bias voltage of 0.2 V is applied.

FIG. 3 is an equivalent circuit diagram showing an amplifier circuit of a third prior art.

In the amplifier circuit of the third prior art, load inductor 253 in power supply circuit 25 of the second prior art is eliminated, and load inductor 171 is included as an IC internal circuit between the connection of constant-voltage source 251 and capacitor 154 and the connection of field-effect transistor 161 and resistor 352. The remaining configuration is the same as that of the amplifier circuit of the second prior art.

In the amplifier circuit of the third prior art, since load inductor 171 reduces static electricity from the outside applied between the drain and the source, a current is suppressed to approximately 2 mA, and breakdown due to static electricity is also unlikely to occur.

FIG. 4 is an equivalent circuit diagram showing an amplifier circuit of a fourth prior art.

The amplifier circuit of the fourth prior art is of a self-bias type, and includes resistor 181 and bypass capacitor 182 in parallel between a source of field-effect transistor 153 and a ground potential in the configuration of the amplifier circuit of the first prior art. The remaining configuration is the same as that of the amplifier circuit of the first prior art.

Since the amplifier circuit of the fourth prior art is of the self-bias type and cancels a bias voltage at a gate of the transistor with a bias voltage at the source, it can operates at a low current.

The amplifier circuits shown as the first to fourth prior arts suffer from the following problems.

Theoretically, the amplifier circuit of the first prior art can be operated at a low current with a bias voltage of 0 V, but actually, the bias voltage cannot be set at 0V to compensate for variations in the threshold voltage Vth of fired-effect transistor 153. Specifically, in the amplifier circuit of the first prior art, the threshold voltage Vth of the pseudo enhancement mode HJ-FET has variations ranging from −0.2 V to 0 V as shown in FIG. 5, and the bias voltage need be set at 0.2 V or higher to compensate for the variations. Since a bias voltage of 0.2 V causes a current of approximately 6 mA to pass through field-effect transistor 153, it is impossible to realize a low current of 1 to 2 mA required for an amplifier circuit in a cellular phone.

The amplifier circuit of the second prior art has its gate as thin as of 50 μm and can operate at a low current, but breakdown readily occurs due to static electricity between the drain and the source.

While the amplifier circuit of the third prior art can operate at a low current and the static breakdown is unlikely to occur, the IC chip size is large since load inductor 171 which is a spiral inductor occupies a large area within the MMIC. In addition, the load inductor disposed outside the IC in the other prior arts is included within the IC, thereby reducing the choice of inductance value.

In the fourth prior art, the capacitance of bypass capacitor 182 cannot be reduced sufficiently since the impedance is large. Thus, at a high frequency, a short circuit is insufficient and negative resistance tends to be arisen, resulting in unstable operations of field-effect transistor 153. Also, a highly dielectric film is required for forming bypass capacitor 182, and complicated manufacturing steps and higher cost are involved.

SUMMARY OF THE INVENTION

It is an object of the present invention to provide a low current amplifier circuit which stably operates at a low current and has a reduced tendency to cause static breakdown.

The low current amplifier circuit according to the present invention comprises a power supply circuit, a bias circuit, and first and second field-effect transistors.

The power supply circuit-provides power supply voltage. The bias circuit biases an input signal. The first field-effect transistor has a small gate width to pass a small current when a bias voltage is applied to its gate to compensate for variations in threshold voltage. The first field-effect transistor has its grounded source and its gate to which an input signal biased with the bias voltage is applied. The second field-effect transistor has a larger gate width than that of the first field-effect transistor, its source connected to a drain of the first field-effect transistor, and its drain supplied with the power supply voltage.

In the low current amplifier circuit of the present invention, a current from static electricity flows through the second field-effect transistor connected in a cascade to the first field-effect transistor, and a current flowing between the drain and the source of the first field-effect transistor is reduced. Thus, the first field-effect transistor having a small gate width for realizing a low current can be protected against the static electricity by the second field-effect transistor having a larger gate width.

The gate of the first field-effect transistor has a width for allowing the transistor to operate at a current of 2 mA or lower when the bias voltage is applied to the gate, and preferably, the width is 50 μm or less.

The gate of the second field-effect transistor has a width for not readily causing static breakdown of the transistor even when a voltage from static electricity is applied between the drain and the source, and preferably, the width is 200 μm or more.

The above and other objects, features, and advantages of the present invention will become apparent from the following description with reference to the accompanying drawings which illustrate examples of the present invention.

DESCRIPTION OF THE PREFERRED EMBODIMENTS

Figure 1:
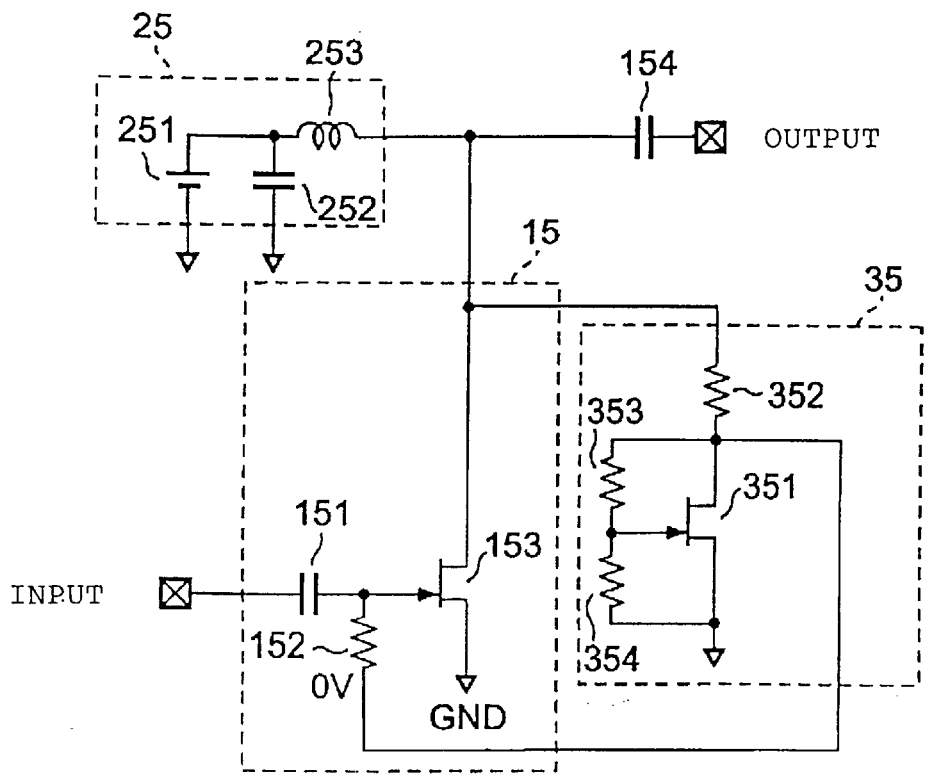
FIG. 1 is an equivalent circuit diagram showing an amplifier circuit of a first prior art with a pseudo enhancement mode HJ-FET.
Figure 5:
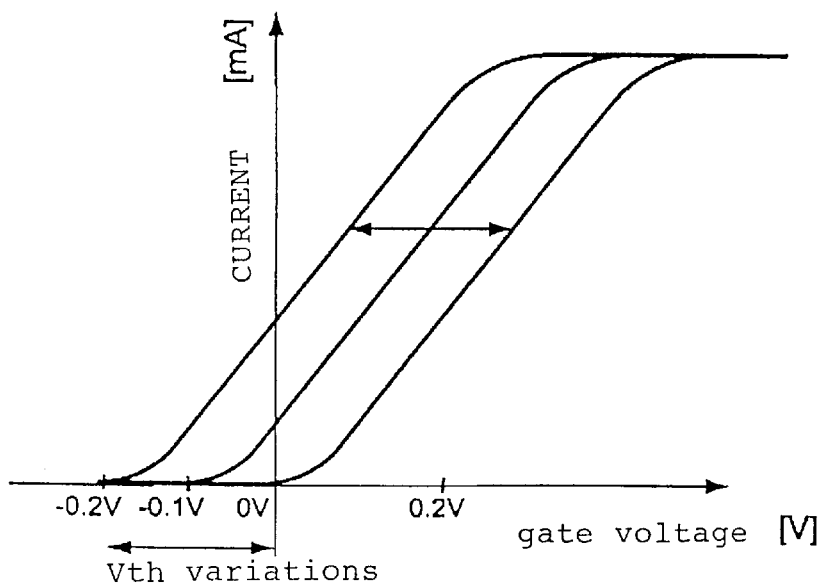
FIG. 5 is a graph showing transfer characteristics of the amplifier circuit shown in FIG. 1.
Figure 2:
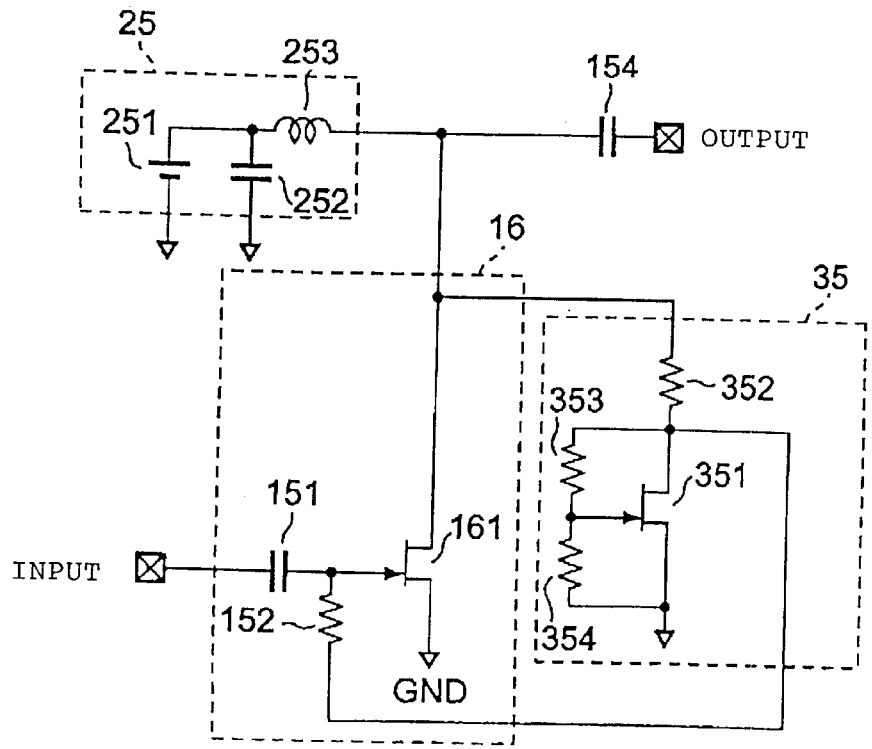
FIG. 2 is an equivalent circuit diagram showing an amplifier circuit of a second prior art.
Figure 3:
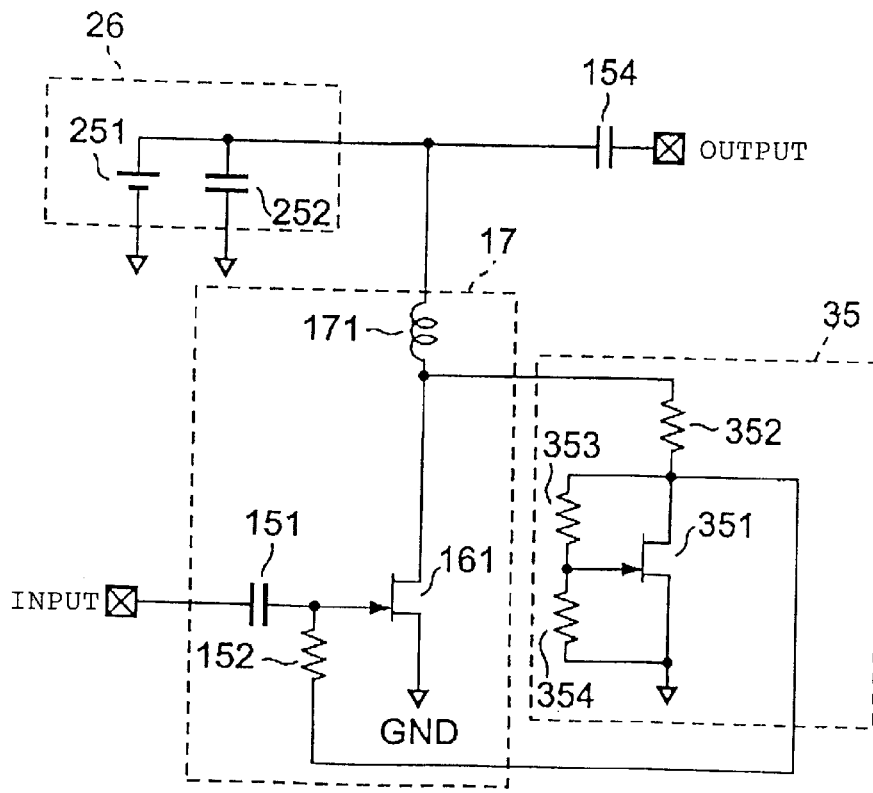
FIG. 3 is an equivalent circuit diagram showing an amplifier circuit of a third prior art.
Figure 4:
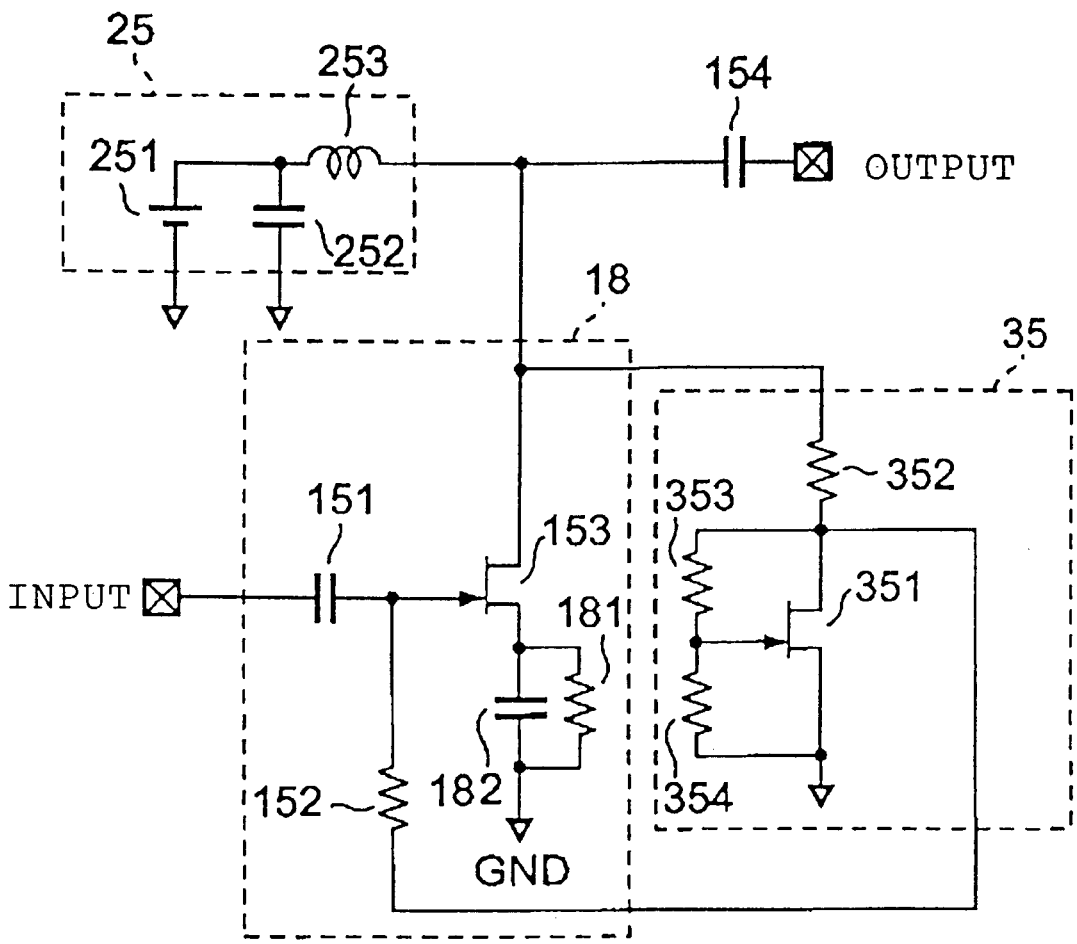
FIG. 4 is an equivalent circuit diagram showing an amplifier circuit of a fourth prior art.
Figure 6:
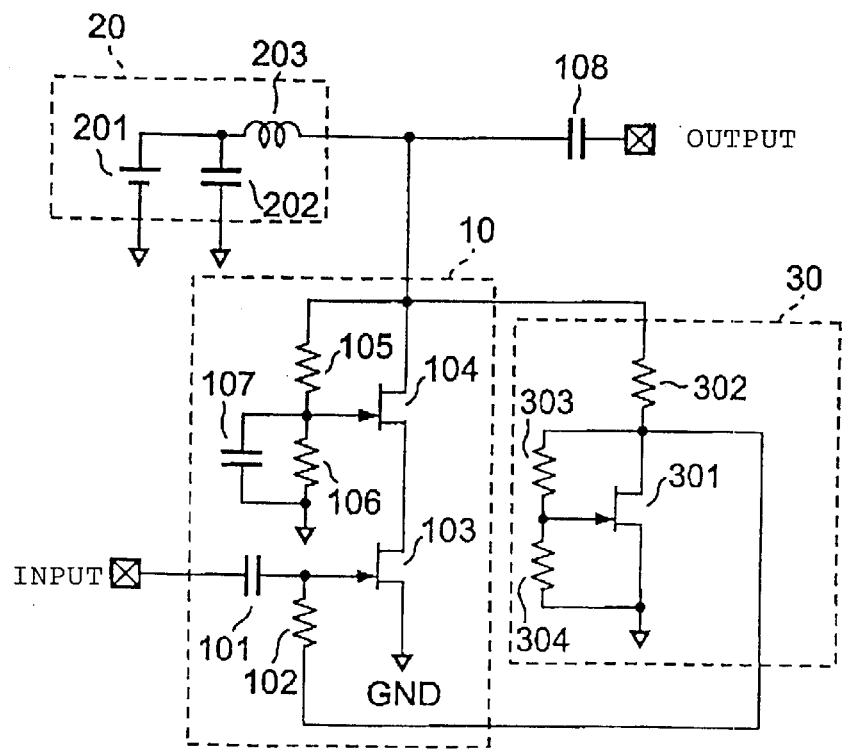
FIG. 6 is an equivalent circuit diagram showing an amplifier circuit of an embodiment of the present invention configured with a pseudo enhancement mode HJ-FET.

Referring now to FIG. 6, there is shown an amplifier circuit according to an embodiment of the present invention configured with a pseudo enhancement mode HJ-FET which comprises input/output circuit 10, power supply circuit 20, active bias circuit 30, and capacitor 108. Input/output circuit 10 amplifies an input signal at a radio frequency and provides it. Power supply circuit 20 supplies input/output circuit 10, with power. Active bias circuit 30 supplies input/output circuit 10 with a bias voltage. Capacitor 108 removes direct-current components from the output. Input/output circuit 10 and active bias circuit 30 are configured as an internal circuit of an IC such as an MMIC, while power supply circuit 20 and capacitor 108 are provided outside the IC.

Input/output circuit 10 includes capacitor 101, resistor 102, field-effect transistor 103 and 104, resistors 105 and 106, and capacitor 107.

Capacitor 101 is connected between an input terminal and a gate of field-effect transistor 103, and removes direct-current components from an input signal. Resistor 102 is connected between an output of active bias circuit 30 and the gate of field-effect transistor 103, and gives a load to the bias voltage supplied from active bias circuit 30. Field-effect transistor 103 has its source grounded, its drain connected to the source of field-effect transistor 104. Field-effect transistors 103 and 104 amplify an input signal. Resistor 105 is connected between the gate and the drain of field-effect transistor 104, and resistor 106 and capacitor 107 are connected in parallel between the gate of field-effect transistor 104 and a ground potential. Resistors 105 and 106 divide the voltage supplied from power supply circuit 20 and apply a bias voltage to the gate of field-effect transistor 104. Capacitor 107 provides a bypass between the gate of field-effect transistor 104 and the ground potential at a radio frequency.

The gate width of field-effect transistor 103 is 50 μm, and the gate width of field-effect transistor 104 is 200 μm.

Capacitor 108 has its one terminal connected to the drain of field-effect transistor 104 and its other terminal connected to the output terminal of the amplifier circuit.

Power supply circuit 20 includes voltage source 201 for supplying a direct-current voltage, capacitor 202 for removing noise in the power supply, and load inductor 203 for giving a load to output from voltage source 201. Capacitor 202 is connected between an output of voltage source 201 and a ground potential. Load inductor 203 has its one terminal connected to the output of voltage source 201 and its other terminal connected to the drain of field-effect transistor 104.

Active bias circuit 30 includes field-effect transistor 301 for controlling the bias voltage supplied to input/output circuit 10, and resistors 302, 303, and 304. Resistor 302 has its one terminal connected to the drain of field-effect transistor 104 and its other terminal connected to a drain of field-effect transistor 301. Resistor 303 is connected between a gate and the drain of field-effect transistor 301. Resistor 304 is connected between the gate of field-effect transistor 301 and a ground potential. A source of field-effect transistor 301 is grounded.

The input signal is biased with the bias voltage supplied from active bias circuit 30 and amplified by field-effect transistors 103 and 104 to output. At this point, since the gate width of field-effect transistor 103 is 50 μm, it can operate at a current of 1 to 2 mA.

Since the field-effect transistor with its gate grounded has a small input impedance, field-effect transistor 104 is mainly responsible for amplification, and field-effect transistor 103 mainly serves as a current source.

For operations against static electricity, a current flows through field-effect transistor 104 with a gate width of 200 μm, thereby reducing a current flowing between the drain and the source of field-effect transistor 103 with a gate width of 50 μm.

Since the current from the static electricity flowing between the drain and the source of field-effect transistor 103 is reduced, field-effect transistor 103 having a small gate width is unlikely to be broken due to the static electricity. Therefore, lower power consumption can be achieved in cellular phones and amplifier circuits less prone to static breakdown can be realized.

Figure 7:
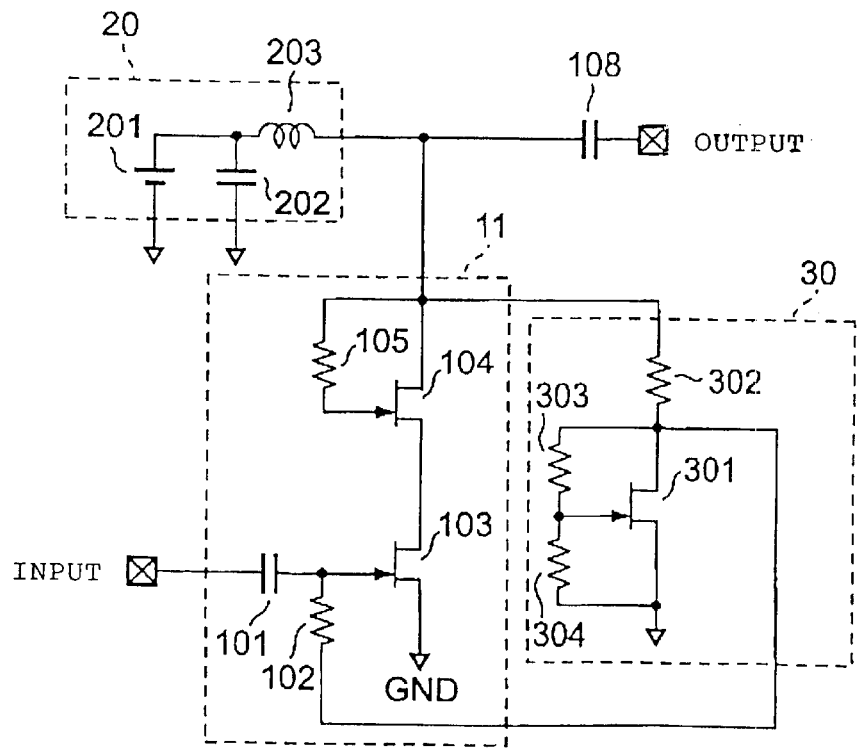
FIG. 7 is an equivalent circuit diagram showing an amplifier circuit of another embodiment of the present invention.

Referring to FIG. 7, there is shown an amplifier circuit of another embodiment of the present invention. The amplifier circuit has a configuration in which second capacitor 107 and third resistor 106 are eliminated from the amplifier circuit shown in FIG. 6, and the remaining configuration is the same as that of the amplifier circuit shown in FIG. 6.

In the amplifier circuit shown in FIG. 7, similarly to the amplifier circuit shown in FIG. 6, an input signal is biased with a bias voltage supplied from active bias circuit 30 and amplified by field-effect transistors 103 and 104 to output. Since field-effect transistor 103 has a gate width of 50 μm, it can also operate at a current of 1 to 2 mA similarly to the amplifier circuit shown in FIG. 6.

For operations against static electricity, a current flows through field-effect transistor 104 and a current flowing between a drain and a source of field-effect transistor 103 is reduced similarly to the amplifier circuit shown in FIG. 6. Therefore, it is possible to make an amplifier circuit less prone to static breakdown and operating at a low current.

The amplifier circuit shown in FIG. 7, however, differs from the amplifier circuit shown in FIG. 6 in that field-effect transistor 103 is mainly responsible for amplification and field-effect transistor 104 mainly serves as a current source.

While the preferred embodiments of the present invention have been described using specific terms, such description is for illustrative purposes only, and it is to be understood that changes and variations may be made without departing from the spirit or scope of the following claims.

What is claimed is:

1. A low current amplifier circuit comprising:

a power supply circuit for providing power supply voltage;

a bias circuit for biasing an input signal;

a first field-effect transistor having a gate with a small width for allowing a small current pass therethrough when a bias voltage is applied to said gate to compensate for variations in threshold voltage, and its source grounded, said gate receiving an input signal biased with said bias voltage; and a second field-effect transistor having its gate with a larger width than that of said first field-effect transistor, its source connected to a drain of said first field-effect transistor, and its drain supplied with said power supply voltage.

2. The low current amplifier circuit according to claim 1, wherein said gate of said first field-effect transistor has a width for allowing said first field-effect transistor to operate at a current of 2 mA or less when said bias voltage is applied to said gate, and said gate of said second field-effect transistor has a width for not readily causing static breakdown in said second field-effect transistor even when a voltage from static electricity is applied between said drain and said source.

3. The low current amplifier circuit according to claim 2, wherein said gate width of said first field-effect transistor is 50 μm or less.

4. The low current amplifier circuit according to claim 2, wherein said gate width of said second field-effect transistor is 200 μm or more.

5. The low current amplifier circuit according to claim 1, further comprising a first resistor connected between said drain and said gate of said second field-effect transistor.

6. The low current amplifier circuit according to claim 5, further comprising a second resistor and a capacitor connected in parallel between said gate of said second field-effect transistor and a ground potential.

7. The low current amplifier circuit according to claim 1, further comprising:

a first capacitor connected between said gate of said first field-effect transistor and an input terminal; and a second capacitor connected between said drain of said second field-effect transistor and an output terminal.

* * * * *